United States Patent
Sutardja (10) Patent No.: US 7,190,224 B2
(45) Date of Patent: Mar. 13, 2007

(54) CLASS D AMPLIFIER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 71 days.

(21) Appl. No.: 10/703,135

(22) Filed: Nov. 6, 2003

(65) Prior Publication Data

US 2005/0099231 A1    May 12, 2005

(51) Int. Cl.
*H03F 3/217* (2006.01)

(52) U.S. Cl. .................................. 330/207 A; 330/251

(58) Field of Classification Search ............ 330/207 A, 330/251
See application file for complete search history.

(56) References Cited

U.S. PATENT DOCUMENTS

| 4,404,511 | A | * | 9/1983 | Nola ........................... 318/729 |
| 4,415,862 | A | | 11/1983 | Kunugi |
| 4,584,566 | A | * | 4/1986 | Arcara ........................ 341/128 |
| 4,791,341 | A | | 12/1988 | Brown et al. |
| 5,077,539 | A | | 12/1991 | Howatt |
| 5,204,809 | A | | 4/1993 | Andresen |
| 5,479,337 | A | * | 12/1995 | Voigt ........................... 363/131 |
| 5,617,058 | A | | 4/1997 | Adrian et al. |
| 6,049,473 | A | * | 4/2000 | Jang et al. ..................... 363/89 |
| 6,348,781 | B1 | * | 2/2002 | Midya et al. ............... 323/224 |
| 6,362,986 | B1 | | 3/2002 | Schultz et al. |
| 6,430,220 | B1 | | 8/2002 | Determan |
| 6,552,607 | B1 | | 4/2003 | Danielson |
| 6,847,257 | B2 | | 1/2005 | Edwards et al. |
| 6,922,101 | B2 | | 7/2005 | Bayko |

FOREIGN PATENT DOCUMENTS

| EP | 0564490 B1 | 10/2001 |
| WO | WO 92/12572 | 7/1992 |
| WO | WO 97/18626 | 5/1997 |
| WO | WO 02/25817 A1 | 3/2002 |
| WO | WO 03/043184 A1 | 5/2003 |

OTHER PUBLICATIONS

Nielsen K., "Parallel Phase Shifted Carrier Pulse Width Modulation (PSCPWM)—A Novel Approach To Switching Power Amplifier Design". Journal Of The Audio Engineering Society, Audio Engineering Society, Mar. 22, 1997: 1-26.
Official Communication from the European Patent Office dated Dec. 15, 2005 for Application No. 04 011 557.8 - 2215; 4 pages.

* cited by examiner

*Primary Examiner*—Patricia Nguyen (57) ABSTRACT

A Class D amplifier receives an input signal and includes a ramp generator that generates a ramp signal and an inverted ramp signal. A signal generator generates a first signal when the ramp signal or the inverted ramp signal transitions from less than the input signal to greater than the input signal. The signal generator generates a second signal when the ramp signal or the inverted ramp signal transitions from greater than the input signal to less than the input signal. An output stage drives current through a load based on the first and second signals.

49 Claims, 7 Drawing Sheets

CLASS D AMPLIFIER

FIELD OF THE INVENTION

The present invention relates to Class D amplifiers, and more particularly to an improved Class D amplifier.

BACKGROUND OF THE INVENTION

Amplifiers are typically used to amplify signals that are output to audio speakers, such as headphones, loudspeakers and/or other audio devices. In wired or non-portable applications, linear amplifiers such as Class A, Class B, and Class AB amplifiers have typically been used. Linear amplifiers include a linear output stage that draws a relatively high bias current while sourcing and sinking current into a load. Therefore, these linear amplifiers consume a relatively high amount of power. Because consumers buying portable audio equipment want to have longer battery life, linear amplifiers are not suitable for use in portable audio applications.

Class D amplifiers have a nonlinear output stage that does not require the high bias current that is used in the linear amplifiers. The increase in efficiency of the output stage, however, is gained at the cost of increased noise and/or distortion. The tradeoff between power consumption and distortion and/or noise has generally been found to be acceptable in portable audio equipment applications.

Figure 1:
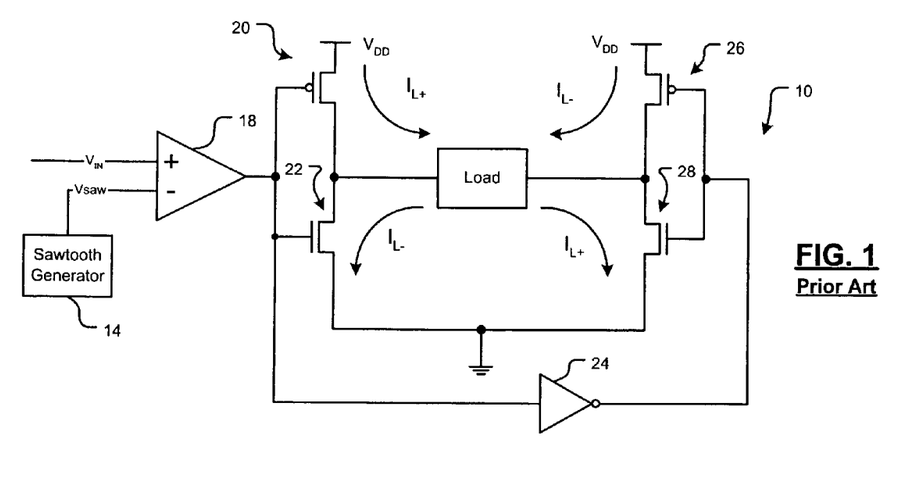
FIG. 1 is an electrical schematic of a Class D amplifier according to the prior art.
Figure 2:
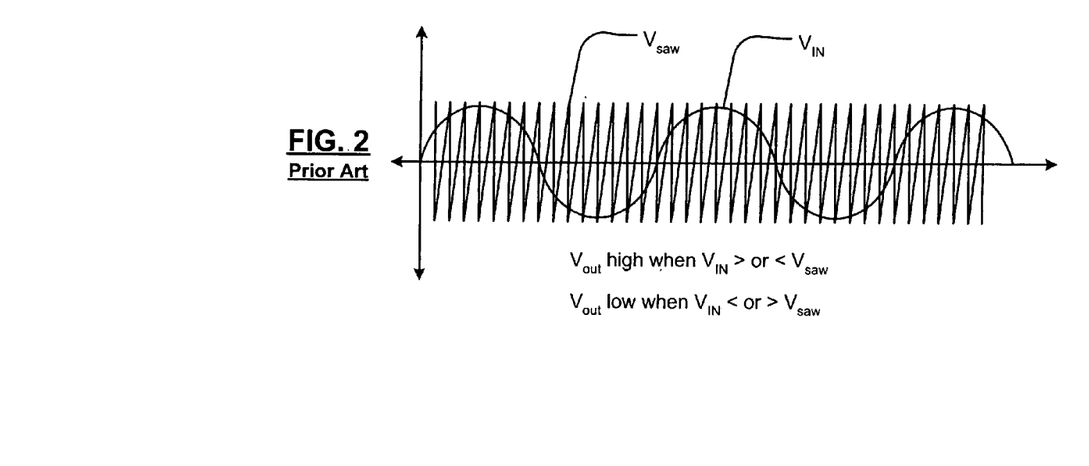
FIG. 2 is a waveform diagram illustrating a sawtooth signal $V_{saw}$ and an input signal $V_{IN}$ according to the prior art.

Referring now to FIGS. 1 and 2, an exemplary Class D amplifier 10 is shown to include a sawtooth waveform generator 14. As can be seen in FIG. 2, a sawtooth signal $V_{saw}$ includes a positive sloped portion that increases from a minimum value to a maximum value followed by a return to the minimum value with an almost-infinite negative slope. The sawtooth signal $V_{saw}$ is input to an inverting input of a comparator 18. An input signal $V_{IN}$ such as an audio signal is input to a non-inverting input of the comparator 18.

An output of the comparator 18 is input to first and second transistors 20 and 22 that are operated as switches. In this example, the first transistor 20 is a PMOS transistor and the second transistor 22 is an NMOS transistor. The output of the comparator 18 is also inverted by an inverter 24 and input to third and fourth transistors 26 and 28 that are also operated as switches. In this example, the third transistor 26 is a PMOS transistor and the fourth transistor 28 is an NMOS transistor.

Referring now to FIG. 2, the sawtooth signal $V_{saw}$ is compared to the input signal $V_{IN}$. When the input signal $V_{IN}$ is greater than the sawtooth signal $V_{saw}$, the output is high. When the input signal $V_{IN}$ is less than the sawtooth signal $V_{saw}$, the output is low. Alternately, when the input signal $V_{IN}$ is greater than the sawtooth signal $V_{saw}$, the output is low. When the input signal $V_{IN}$ is less than the sawtooth signal $V_{saw}$, the output is high. The transistors 20, 22, 26 and 28 are switched on and off to drive current through a load 40 as depicted in FIG. 1.

SUMMARY OF THE INVENTION

A Class D amplifier according to the present invention receives an input signal and includes a ramp generator that generates a ramp signal and an inverted ramp signal. A signal generator generates a first signal when the ramp signal transitions from less than the input signal to greater than the input signal and when the inverted ramp signal transitions from less than the input signal to greater than the input signal.

In other features, the signal generator generates a second signal when the ramp signal transitions from greater than the input signal to less than the input signal and when the inverted ramp signal transitions from greater than the input signal to less than the input signal. The signal generator comprises an edge detector and a phase detector.

In still other features, the edge detector comprises a first comparator that compares the ramp signal to the input signal and a second comparator that compares the inverted ramp signal to the input signal. The edge detector generates a first pulse when rising edges occur in outputs of the comparators and generates a second pulse when falling edges occur in the outputs of the comparators. The edge detector comprises a first one shot that receives an output of the first comparator and that generates the first pulse when a rising edge occurs. A second one shot receives an output of the first comparator and generates the second pulse when a falling edge occurs. A third one shot receives an output of the second comparator and generates the first pulse when a rising edge occurs. A fourth one shot receives an output of the second comparator and generates the second pulse when a falling edge occurs.

In still other features, a frequency of the ramp signal is approximately two orders of magnitude higher than a frequency of the input signal. A positive slope of the ramp signal is approximately equal to a negative slope of the ramp signal. A positive slope of the inverted ramp signal is approximately equal to a negative slope of the inverted ramp signal.

In other features, an output stage receives the first and second signals from the signal generator and selectively drives output current based on the first and second signals. The output stage may include a single ended drive stage or a balanced H-bridge.

A system comprises the Class D amplifier and a load that receives the output current. The Class D amplifier includes a low pass filter that is arranged between the output stage and the load.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

Figure 3:
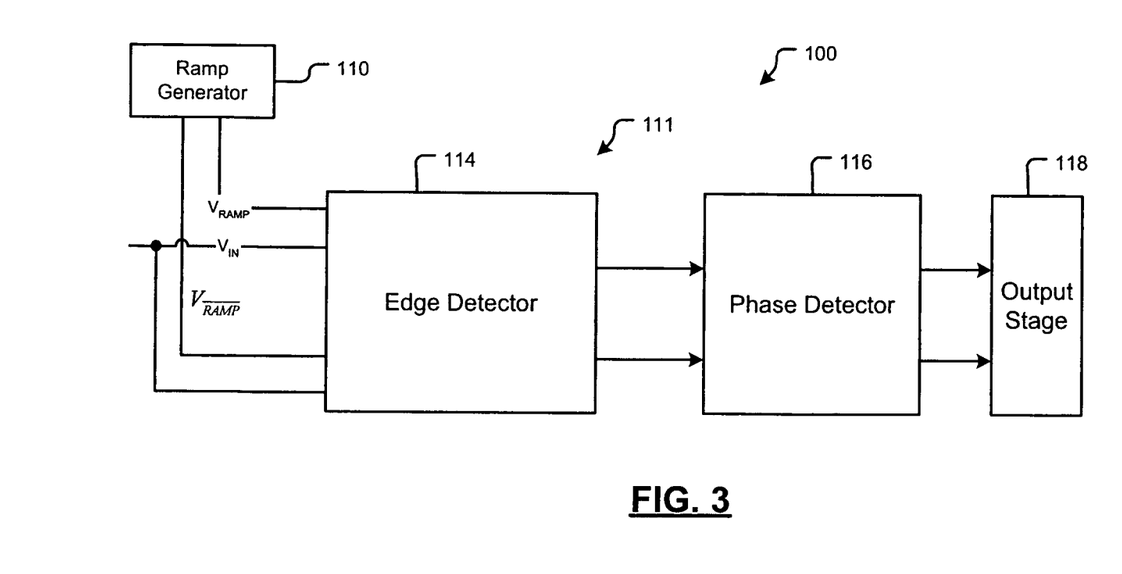
FIG. 3 is a functional block diagram of a Class D amplifier according to the present invention

Referring now to FIG. 3, a Class D amplifier 100 according to the present invention is shown. The Class D amplifier 100 includes a ramp generator 110 that generates a ramp signal ($V_{RAMP}$) and an inverted ramp signal ($V_{\overline{RAMP}}$). As used herein, the terms ramp signal and inverted ramp signal refer to signals having alternating positive and negative slopes, which are substantially equal. The ramp signal $V_{RAMP}$ is output to a signal generator 111 that generates UP and DOWN signals for an output stage 118. The output stage 118 drives current through the load based on the UP and DOWN signals. The signal generator 111 includes an edge detector 114 and a phase detector 116. The ramp signal $V_{RAMP}$, the inverted ramp signal $V_{\overline{RUMP}}$ and the input signal $V_{IN}$ are output to the edge detector circuit 114.

The edge detector circuit 114 outputs first and second pulses when rising and falling edges of the ramp and inverted ramp signals transition above and below, respectively, the input signal. In other words, the edge detector circuit 114 outputs a first pulse when $V_{RAMP}$ transitions from a value less than $V_{IN}$ to a value greater than $V_{IN}$ and a second pulse when $V_{RAMP}$ transitions from a value greater than $V_{IN}$ to a value less than $V_{IN}$, respectively. The edge detector circuit 114 also outputs the first pulse when $V_{\overline{RAMP}}$ transitions from a value less than $V_{IN}$ to a value greater than $V_{IN}$ and the second pulse when $V_{\overline{RAMP}}$ transitions from a value greater than $V_{IN}$ to a value less than $V_{IN}$, respectively.

Outputs of the edge detector circuit 114 are input to a phase detector 116. The phase detector 116 sends an UP signal when the first pulse is received until the second pulse is received. When the second pulse is received, the phase detector 116 sends a DOWN signal until the first pulse is received. An output of the phase detector 116 is transmitted to an output stage 118, which drives current across the load based on the UP and DOWN signals.

Figure 4:
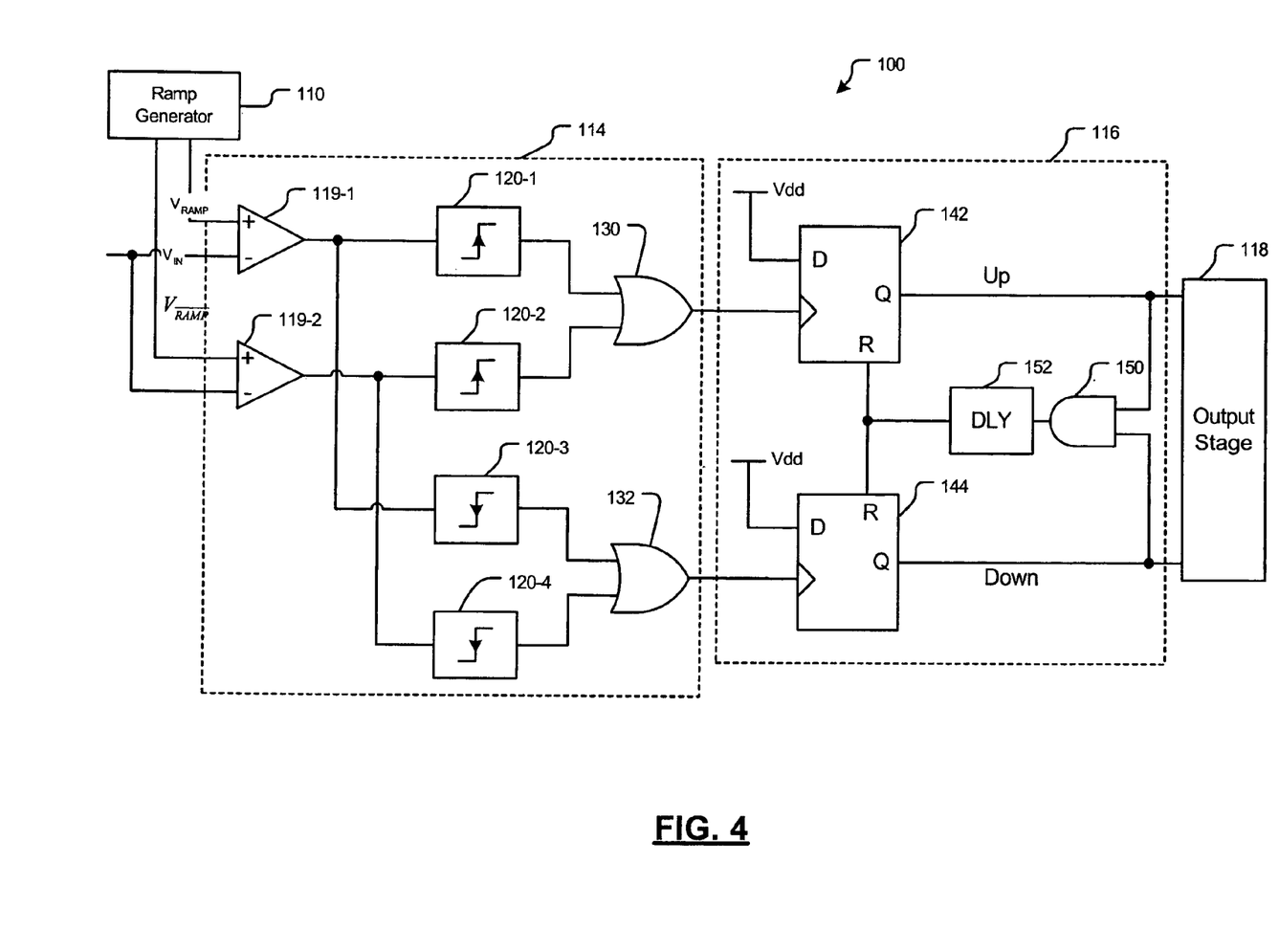
FIG. 4 is electrical schematic of one exemplary implementation of the Class D amplifier of FIG. 3.

Referring now to FIG. 4, an exemplary implementation of the Class D amplifier 100 is shown. The edge detector circuit 114 includes comparators 119-1 and 119-2 and one-shot circuits 120-1 and 120-3 and 120-2 and 120-4, respectively. The ramp signal $V_{RAMP}$ is output to a non-inverting input of the first comparator 119-1. The inverted ramp signal $V_{\overline{RAMP}}$ is output to a non-inverting input of the second comparator 119-2. The input signal $V_{IN}$ is input to inverting inputs of the comparators 119-1 and 119-2.

Outputs of the comparators 119-1 and 119-2 are input to the one-shot circuits 120. In one implementation, the one-shot circuits 120-1 and 120-2 generate an output pulse when there is a positive edge sensed at the input thereof. The one-shot circuits 120-3 and 120-4 generate an output pulse when there is a negative edge sensed at the input thereof.

Outputs of the one-shot circuits 120-1 and 120-2 are input to OR gate 130. Outputs of the one-shot circuits 120-3 and 120-4 are input to OR gate 132. Outputs of the OR gates 130 and 132 are input to a phase detector 116. The phase detector 116 operates in a manner that is similar to phase detectors in modern phase locked loops (PLLs). When there is no phase error in modern PLLs, a very small up and down pulse current is generated. In a Class D amplifier, however, voltage pulses are used instead of current.

In one implementation, the phase detector 116 includes a flip-flop 142 that communicates with the output of the OR gate 130 and a flip-flop 144 that communicates with the output of the OR gate 132. D inputs of the flip-flops 142 and 144 are connected to a voltage bias $V_{dd}$. A Q output of the flip-flop 142 provides a first or UP signal. A Q output of the flip-flop 144 provides a second or DOWN signal. The UP signal and the DOWN signal are fed back through an AND gate 150 and a delay 152 to reset (R) inputs of the flip-flops 142 and 144. The UP signal and the DOWN signal are also transmitted to an output stage 118, as will be described below. The ramp signal preferably has a frequency that is 2 orders of magnitude higher than the input frequency (e.g. 20 kHz and 1–2 MHz).

Figure 5:
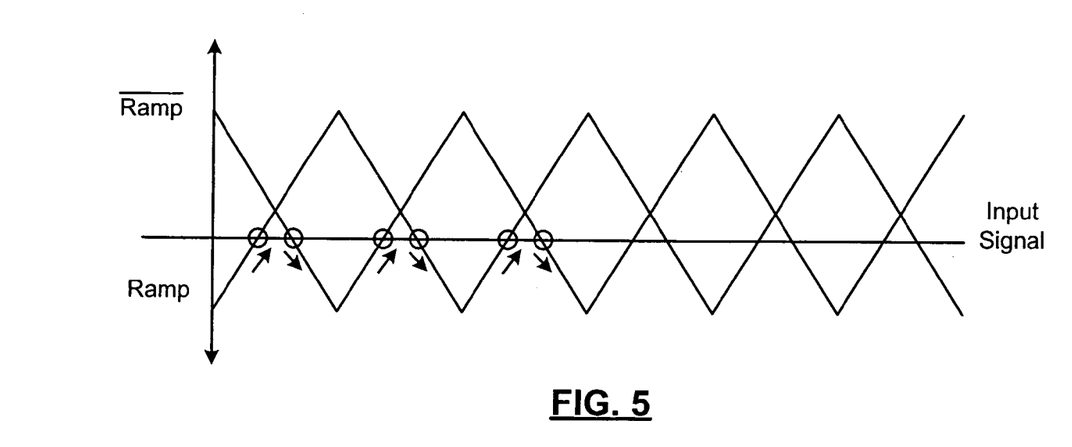
FIG. 5 is a waveform diagram of a ramp signal $V_{RAMP}$ and an input signal $V_{IN}$ according to the present invention.

Referring now to FIG. 5, the ramp signal $V_{RAMP}$, the inverted ramp signal $V_{\overline{RAMP}}$, and an input signal $V_{IN}$ are shown. The UP signal is initiated on a rising edge of either the ramp signal $V_{RAMP}$ or the inverted ramp signal $V_{\overline{RAMP}}$ crossing the input signal $V_{IN}$. The DOWN signal is initiated on a falling edge of either the ramp signal $V_{RAMP}$ or the inverted ramp signal $V_{\overline{RAMP}}$ crossing the input signal $V_{IN}$.

Figure 6:
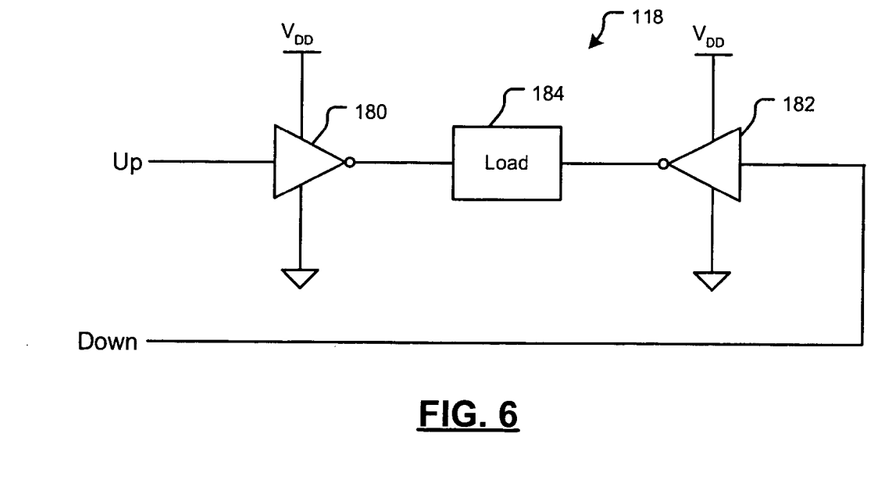
FIG. 6 illustrates an exemplary output stage of the Class D amplifier according to the present invention.

Referring now to FIG. 6, an exemplary output stage 118 includes an amplifier 180 that is switched on when the UP signal has a first state and off when the UP signal has a second state. The amplifier 182 is switched on when the DOWN signal has a first state and off when the UP signal has a second state.

Figure 7:
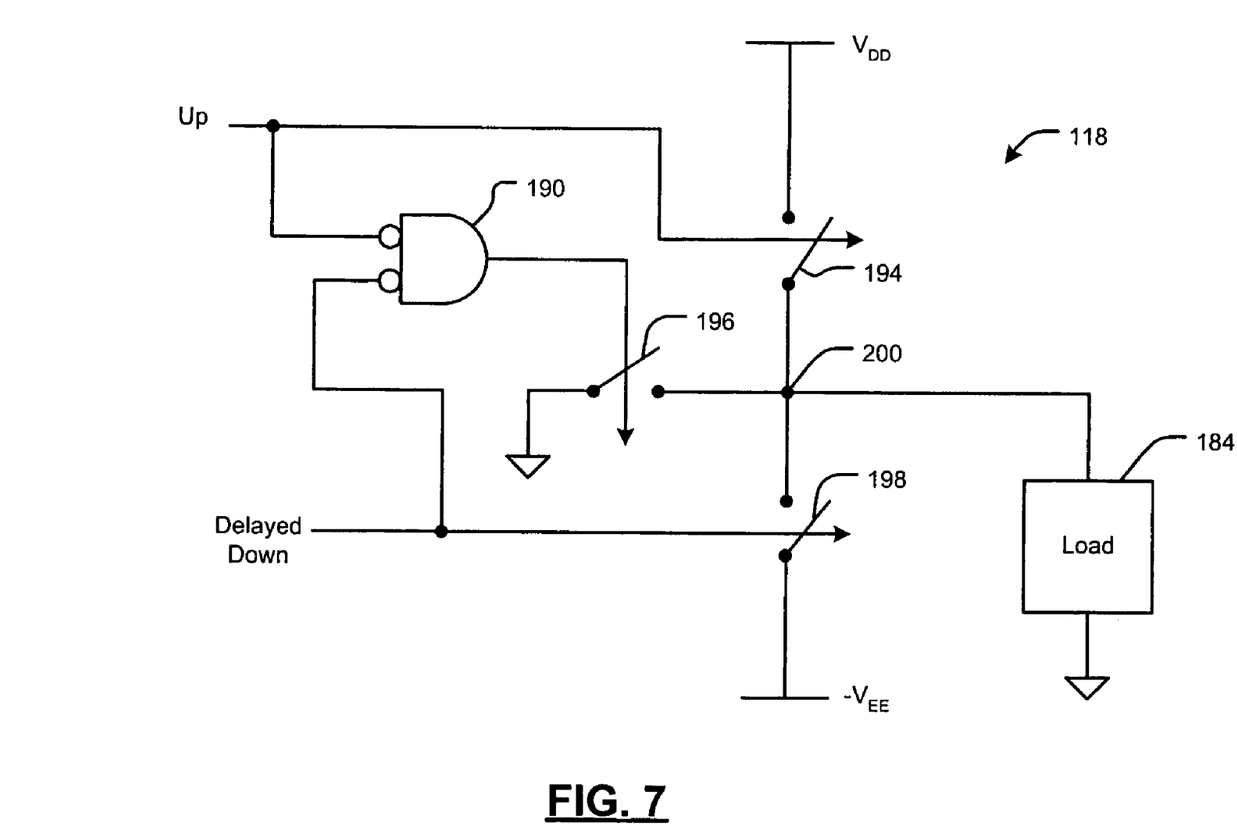
FIG. 7 illustrates a single ended output stage for the Class D amplifier according to the present invention.

Referring now to FIG. 7, an alternate output stage 118 is configured as a single ended drive stage. The output stage 118 includes an AND gate 190 with inverted inputs, which are connected to the UP signal and a delayed DOWN signal. The UP signal controls a first switch 194. An output of the AND gate 190 controls a second switch 196. The first switch 194 selectively connects $V_{DD}$ to a node 200. The second switch 196 selectively connects the node 200 to ground. The delayed DOWN signal controls a third switch 198, which selectively connects the node 200 to negative $V_{EE}$. The load 184 is connected between the node 200 and ground.

In a preferred embodiment, the DOWN signal is delayed by at least the minimum pulse width of the phase detector 116 to avoid conflict between the switches 194 and 198. In a preferred embodiment, the delay is preferably at least two times the minimum delay described above. The switch 196 is on only when the UP and the delayed DOWN signals are inactive. In PLL applications, the DOWN signal does not need to be delayed because current is used. Therefore UP and DOWN signals can occur at the same time. With voltage signals, the DOWN signal is preferably delayed to avoid the crowbar short-circuit effect of both the top and bottom transistors being on.

Figure 8:
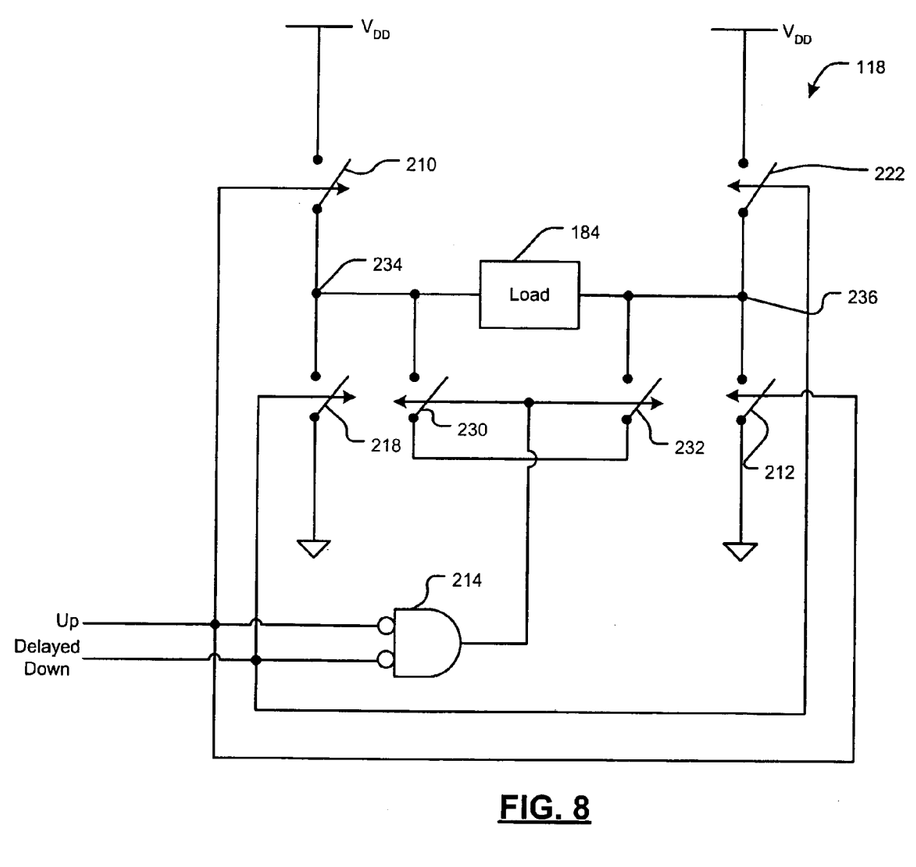
FIG. 8 illustrates a balanced H-bridge output stage for the Class D amplifier according to the present invention.

Referring now to FIG. 8, an alternate output stage 118 is configured as a balanced H-bridge implementation. The UP signal controls first and second switches 210 and 212 and is input to an AND gate 214 with inverted inputs. The delayed DOWN signal controls switches 218 and 222 and is input to AND gate 214, which has inverted inputs. The output of the AND gates 214 controls switches 230 and 232, which are connected across the load 184. The switches 210 and 222 are connected between $V_{DD}$ and nodes 234 and 236, respectively. The switches 218 and 212 are connected between the nodes 234 and 236, respectively, and ground.

Figure 9:
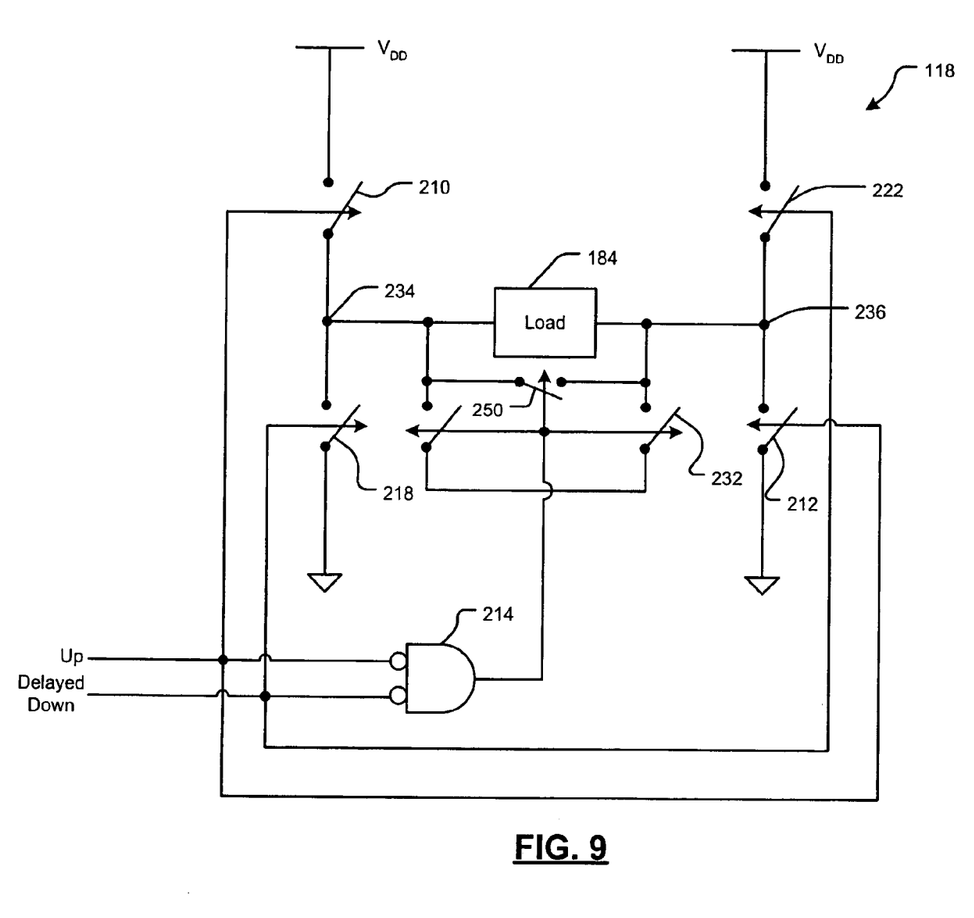
FIG. 9 illustrates an alternate balanced H-bridge output stage for the Class D amplifier according to the present invention.

Referring now to FIG. 9, an alternate output stage 118 that is similar to the output stage in FIG. 8 is shown. The output stage 118 in FIG. 9 includes an additional switch 250 that is controlled by the output of the AND gate 214. The switch 250 is connected across the load 184.

As can be appreciated, the output common mode of the output stages 118 that are shown in FIGS. 8 and 9 does not move around and is centered between the positive and negative power supplies.

Figure 10:
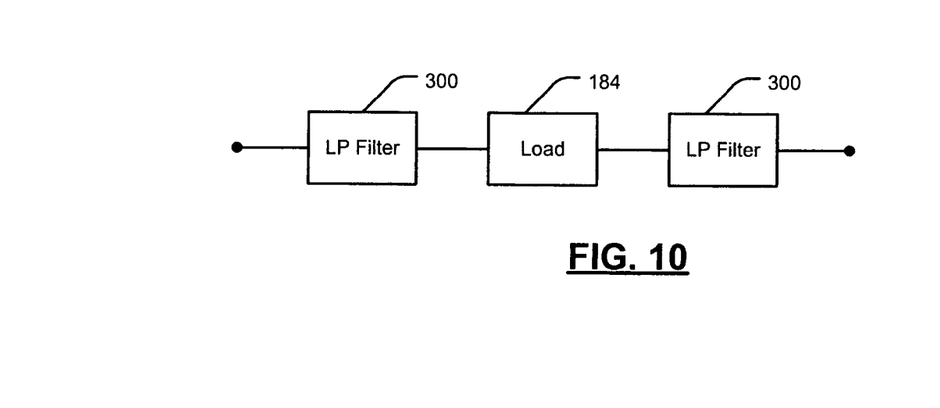
FIG. 10 illustrates low pass filters of the Class D amplifier and the load.

Referring now to FIG. 10, the signal to the load 184 can be filtered using one or more low pass filter circuits 300. The low pass filter circuits 300 may include one or more inductors and/or capacitors that remove high frequency switching components. For example, the filter may include a series inductor and a parallel capacitor. The optional filters 300 may not be needed if the load is an inductive load such as a loudspeaker load, which is mechanically similar to a low pass filter.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A Class D amplifier that receives an input signal, comprising:
    a ramp generator that generates a ramp signal and an inverted ramp signal; and
    a signal generator that generates a first signal after said ramp signal transitions from less than the input signal to greater than the input signal and after said inverted ramp signal transitions from less than the input signal to greater than the input signal, and wherein said signal generator generates a second signal after said ramp signal transitions from greater than the input signal to less than the input signal and after said inverted ramp signal transitions from greater than the input signal to less than the input signal.

2. The Class D amplifier of claim 1 wherein when said signal generator outputs one of said first and second signals, said signal generator selectively transitions to the other of said first and second signals when the other of said first and second signals is generated.

3. The Class D amplifier of claim 1 wherein said signal generator comprises an edge detector.

4. A Class D amplifier that receives an input signal, comprising:
    a ramp generator that generates a ramp signal and an inverted ramp signal: and
    a signal generator that generates a first signal after said ramp signal transitions from less than the input signal to greater than the input signal and after said inverted ramp signal transitions from less than the input signal to greater than the input signal, wherein said signal generator further comprises an edge detector and a phase detector.

5. The Class D amplifier of claim 3 wherein said edge detector comprises:
    a first comparator that compares said ramp signal to the input signal; and
    a second comparator that compares said inverted ramp signal to the input signal.

6. A Class D amplifier that receives an input signal, comprising:
    a ramp generator that generates a ramp signal and an inverted ramp signal; and
    a signal generator that generates a first signal after said ramp signal transitions from less than the input signal to greater than the input signal and after said inverted ramp signal transitions from less than the input signal to greater than the input signal;
    wherein said signal generator comprises an edge detector including a first comparator that compares said ramp signal to the input signal and a second comparator that compares said inverted ramp signal to the input signal, and
    wherein said edge detector generates a first pulse when rising edges occur in outputs of said first and second comparators and generates a second pulse when falling edges occur in said outputs of said first and second comparators.

7. The Class D amplifier of claim 6 wherein said edge detector comprises:
    a first one shot that receives an output of said first comparator and that generates said first pulse when a rising edge occurs;
    a second one shot that receives an output of said first comparator and that generates said second pulse when a falling edge occurs;
    a third one shot that receives an output of said second comparator and that generates said first pulse when a rising edge occurs; and
    a fourth one shot that receives an output of said second comparator and that generates said second pulse when a falling edge occurs.

8. A Class D amplifier that receives an input signal, comprising;
    a ramp generator that generates a ramp signal and an inverted ramp signal; and
    a signal generator that generates a first signal after said ramp signal transitions from less than the input signal to greater than the input signal and after said inverted ramp signal transitions from less than the input signal to greater than the input signal, wherein a frequency of said ramp signal is approximately two orders of magnitude higher than a frequency of the input signal.

9. The Class D amplifier of claim 1 wherein a positive slope of said ramp signal is approximately equal to a negative slope of said ramp signal and wherein a positive slope of said inverted ramp signal is approximately equal to a negative slope of said inverted ramp signal.

10. The Class D amplifier of claim 1 further comprising an output stage that receives said first and second signals from said signal generator and that selectively drives output current based on said first and second signals.

11. The Class D amplifier of claim 10 wherein said output stage includes first and second switches that are controlled by said first and second signals, respectively.

12. The Class D amplifier of claim 10 wherein said output stage includes a balanced H-bridge.

13. A system comprising the Class D amplifier of claim 10 and further comprising a load that receives said output current.

14. The system of claim 13 wherein said load comprises an audio speaker.

15. The system of claim 13 wherein said Class D amplifier further comprises a low pass filter that is arranged between said output stage and said load.

16. A Class D amplifier that receives an input signal, comprising:

ramp generating means for generating a ramp signal and an inverted ramp signal; and signal generating means for generating a first signal when said ramp signal transitions from less than the input signal to greater than the input signal and when said inverted ramp signal transitions from less than the input signal to greater than the input signal and for generating a second signal when said ramp signal transitions from greater than the input signal to less than the input signal and when said inverted ramp signal transitions from greater than the input signal to less than the input signal.

17. The Class D amplifier of claim 16 wherein when said signal generator outputs one of said first and second signals, said signal generator selectively transitions to the other of said first and second signals when the other of said first and second signals is generated.

18. The Class D amplifier of claim 16 wherein said signal generating means comprises edge detecting means for detecting when said ramp signal and said inverted ramp signal cross said input signal.

19. A Class D amplifier that receives an input signal, comprising:
ramp generating means for generating a ramp signal and an inverted ramp signal; and
signal generating means for generating a first signal after said ramp signal transitions from less than the input signal to greater than the input signal and after said inverted ramp signal transitions from less than the input signal to greater than the input signal,
wherein said signal generating means further comprises:
edge detecting means for detecting when said ramp signal and said inverted ramp signal cross said input signal; and
phase detecting means that communicates with said edge detecting means for generating said first and second signals based on said transitions.

20. The Class D amplifier of claim 18 wherein said edge detecting means comprises:
first comparing means for comparing said ramp signal to the input signal; and
second comparing means for comparing said inverted ramp signal to the input signal.

21. A Class D amplifier that receives an input signal, comprising:
ramp generating means for generating a ramp signal and an inverted ramp signal; and
signal generating means for generating a first signal after said ramp signal transitions from less than the input signal to greater than the input signal and after said inverted ramp signal transitions from less than the input signal to greater than the input signal, wherein said signal generating means comprises edge detecting means for detecting when said ramp signal and said inverted ramp signal cross said input signal and wherein said edge detecting means comprises first comparing means for comparing said ramp signal to the input signal and second comparing means for comparing said inverted ramp signal to the input signal,
wherein said edge detecting means generates a first pulse when rising edges occur in outputs of said first and second comparing means and generates a second pulse when falling edges occur in said outputs of said first and second comparing means.

22. The Class D amplifier of claim 21 wherein said detecting means comprises:

first one shot means that receives an output of said first comparing means for generating said first pulse when a rising edge occurs;
second one shot means that receives an output of said first comparing means for generating said second pulse when a falling edge occurs;
third one shot means that receives an output of said second comparing means for generating said first pulse when a rising edge occurs; and
fourth one shot means that receives an output of said second comparing means for generating said second pulse when a falling edge occurs.

23. A Class D amplifier that receives an input signal, comprising:
ramp generating means for generating a ramp signal and an inverted ramp signal; and
signal generating means for generating a first signal after said ramp signal transitions from less than the input signal to greater than the input signal and after said inverted ramp signal transitions from less than the input signal to greater than the input signal,
wherein a frequency of said ramp signal is approximately two orders of magnitude higher than a frequency of the input signal.

24. The Class D amplifier of claim 16 wherein a positive slope of said ramp signal is approximately equal to a negative slope of said ramp signal and wherein a positive slope of said inverted ramp signal is approximately equal to a negative slope of said inverted ramp signal.

25. The Class D amplifier of claim 16 further comprising output means that receives said first and second signals from said signal generating means for selectively driving output current based on said first and second signals.

26. The Class D amplifier of claim 25 wherein said output means comprises first and second switching means for switching that are controlled by said first and second signals, respectively.

27. The Class D amplifier of claim 25 wherein said output means comprises a balanced H-bridge.

28. A system comprising the Class D amplifier of claim 25 and further comprising a load that receives said output current.

29. The system of claim 28 wherein said load comprises an audio speaker.

30. The system of claim 28 wherein said Class D amplifier further comprises filter means that is arranged between said output stage and said load for low pass filtering said output current.

31. A method for operating a Class D amplifier that receives an input signal, comprising:
generating a ramp signal;
generating an inverted ramp signal;
generating a first signal after said ramp signal transitions from less than the input signal to greater than the input signal;
generating said first signal after said inverted ramp signal transitions from less than the input signal to greater than the input signal;
generating a second signal after said ramp signal transitions from greater than the input signal to less than the input signal; and
generating said second signal after said inverted ramp signal transitions from greater than the input signal to less than the input signal.

32. The method of claim 31 wherein when said first state of one of said first and second signals is output and further comprising selectively transitioning to said first state of the other of said first and second signals when said first state of the other of said first and second signals is generated.

33. The method of claim 32 further comprising selectively driving an output current based on said first and second signals.

34. A method for operating a Class D amplifier that receives an input signal, comprising:
generating a ramp signal;
generating an inverted ramp signal;
generating a first signal after said ramp signal transitions from less than the input signal to greater than the input signal;
generating said first signal after said inverted ramp signal transitions from less than the input signal to greater than the input signal, wherein a frequency of said ramp signal is approximately two orders of magnitude higher than a frequency of the input signal.

35. The method of claim 31 wherein a positive slope of said ramp signal is approximately equal to a negative slope of said ramp signal.

36. The method of claim 33 further comprising low pass filtering said output current.

37. The method of claim 31 further comprising controlling first and second switches in an output stage using said first and second signals.

38. The Class D amplifier of claim 10 wherein said output stage comprises:
a first switch that selectively connects a load to a first voltage reference based on said first signal; and
a second switch that selectively connects said load to a second voltage reference based on said second signal.

39. The Class D amplifier of claim 38 wherein said output stage comprises a third switch that selectively connects said load to ground based on said first and second signals.

40. The Class D amplifier of claim 39 wherein said third switch is selectively controlled based on one of said first signal and a delayed second signal and a delayed first signal and said second signal.

41. The Class D amplifier of claim 10 wherein said output stage comprises:
first and second switches that selectively connect one end of a load to a first voltage reference and an opposite end of said load to a reference potential based on said first signal; and
third and fourth switches that selectively connect said opposite end of said load to a second voltage reference and said one end of said load to said reference potential based on said second signal.

42. The Class D amplifier of claim 41 wherein said output stage comprises a fifth switch that selectively connects said one end and said opposite end of said load to ground based on said first and second signals.

43. The Class D amplifier of claim 42 wherein said output stage comprises a fifth switch that selectively connects said one end and said opposite end of said load to ground based on one of said first signal and a delayed second signal and a delayed first signal and said second signal.

44. The Class D amplifier of claim 25 wherein said output stage comprises:
first switching means for selectively connecting a load to a first voltage reference based on said first signal; and
second switching means for selectively connecting said load to a second voltage reference based on said second signal.

45. The Class D amplifier of claim 44 wherein said output stage comprises third switching means for selectively connecting said load to ground based on said first and second signals.

46. The Class D amplifier of claim 45 wherein said third switching means is selectively controlled based on one of said first signal and a delayed second signal and a delayed first signal and said second signal.

47. The Class D amplifier of claim 25 wherein said output stage comprises:
first and second switching means for selectively connecting one end of a load to a first voltage reference and an opposite end of said load to a reference potential based on said first signal; and
third and fourth switching means for selectively connecting said opposite end of said load to a second voltage reference and said one end of said load to said reference potential based on said second signal.

48. The Class D amplifier of claim 47 wherein said output stage comprises fifth switching means for selectively connecting said one end and said opposite end of said load to ground based on said first and second signals.

49. The Class D amplifier of claim 48 wherein said output stage comprises fifth switching means for selectively connecting said one end and said opposite end of said load to ground based on one of said first signal and a delayed second signal and a delayed first signal and said second signal.

* * * * *

UNITED STATES PATENT AND TRADEMARK OFFICE
CERTIFICATE OF CORRECTION

PATENT NO.        : 7,190,224 B2                                        Page 1 of 1
APPLICATION NO.   : 10/703135
DATED             : March 13, 2007
INVENTOR(S)       : Sehat Sutardja It is certified that error appears in the above-identified patent and that said Letters Patent is hereby corrected as shown below:

Column 3, Line 27:    Delete " $V_{\overline{RUMP}}$ " and insert -- $V_{\overline{RAMP}}$ --

Signed and Sealed this

Twenty-ninth Day of May, 2007

JON W. DUDAS
*Director of the United States Patent and Trademark Office*